United States Patent
Crespi et al.

(10) Patent No.: US 7,982,525 B2
(45) Date of Patent: Jul. 19, 2011

(54) SYSTEMS AND METHODS FOR DRIVING HIGH POWER STAGES USING LOWER VOLTAGE PROCESSES

(75) Inventors: Lorenzo Crespi, Costa Mesa (IT); Ketan B Patel, Lake Forest, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 12/390,333

(22) Filed: Feb. 20, 2009

(65) Prior Publication Data

US 2010/0214000 A1    Aug. 26, 2010

(51) Int. Cl.
*H03L 5/00* (2006.01)
(52) U.S. Cl. .............. 327/333; 327/63; 327/81
(58) Field of Classification Search .............. 326/62–63, 326/80–81; 327/306, 333
See application file for complete search history.

(56) References Cited

U.S. PATENT DOCUMENTS

| | | | |
|---|---|---|---|
| 5,274,276 A * | 12/1993 | Casper et al. | 326/21 |
| 5,751,179 A * | 5/1998 | Pietruszynski et al. | 327/379 |
| 6,184,716 B1 | 2/2001 | Depetro et al. | |
| 6,285,233 B1 | 9/2001 | Ribellino et al. | |
| 6,429,686 B1 * | 8/2002 | Nguyen | 326/86 |
| 6,518,818 B1 | 2/2003 | Hynes | |
| 6,762,645 B1 * | 7/2004 | Grant | 330/251 |
| 6,937,091 B2 * | 8/2005 | Tanaka et al. | 330/10 |
| 2005/0017755 A1 | 1/2005 | Chiang | |
| 2005/0078729 A1 | 4/2005 | Zhao | |

OTHER PUBLICATIONS

Marco Berkhout, "An Integrated 200-W Class-D Audio Amplifier", IEEE Journal of Solid-State Circuits, pp. 1198-1206, vol. 38, No. 7, Jul. 2003.
Kipo, "Notification of Transmittal of The International Search Report and the Written Opinion of the International Searching Authority", report, Sep. 28, 2010, 8 pages, Korean Intellectual Property Offices, South Korea.

* cited by examiner

*Primary Examiner* — Dinh T. Le
(74) *Attorney, Agent, or Firm* — Jackson Walker L.L.P.; Christopher J. Rourk

(57) ABSTRACT

In today's environment class-D amplifiers are used to provide an integrated solution for applications such as powered audio devices due to their advantages in power consumption and size over more traditional analog amplifiers. Due to power output requirements, the output stages of power drivers such as class-D amplifiers require a supply voltage in excess of the technologically allowed voltage for the switches in the output stage. A level shifter is used to ensure voltages supplied to the output switches do not exceed the technological limits. An ideal level shifter should provide the optimal voltage swing to output switches under all process, supply voltage and temperature (PVT) variations. The ideal level shifter should also provide fast transitions when the control signal changes from high to low and low to high.

18 Claims, 6 Drawing Sheets

SYSTEMS AND METHODS FOR DRIVING HIGH POWER STAGES USING LOWER VOLTAGE PROCESSES

BACKGROUND OF THE INVENTION

1. Field of the Inventions

The invention relates to integrated power driver circuits and in particular to an improved level-shifter for driving the output stage of an integrated power driver.

2. Background Information

In today's environment, class-D amplifiers are used to provide an integrated solution for applications such as powering audio devices. Class-D amplifiers have an advantage in power consumption and size over more traditional analog amplifiers. Generally, they do not require bulky transformers or heat sinks making them more suitable for integrated circuits.

In particular, the class-D amplifier unlike a traditional amplifier produces an output comprising a sequence of pulses. Typically, these pulses vary in width or in density in methods known as pulse width modulation (PWM) or pulse density modulation (PDM). The average value of these pulses represents the instantaneous amplitude of the output signal. These pulses introduce unwanted high-frequency harmonics, which are typically removed by a low pass filter.

FIG. 1 is a block diagram illustrating the typical architecture of class-D amplifier 100. The input signal is converted to pulses using modulator 102 which can be a pulse width modulator or a pulse density modulator. A common implementation of a pulse width modulator uses a high speed comparator to compare the input signal against a triangle wave. The modulated signal is then amplified by amplifier 104 and finally demodulated by low pass filter 106. The demodulated signal can then be used, for example by speaker 108.

Of particular interest in integrated power drivers such as Class-D amplifiers as described above and DC-DC converters are the output stages which typically use a complimentary MOS structure. FIG. 2 is a circuit diagram exemplifying the output stage of a power driver. At the output is a p-type field effect transistor (PFET) 202, also referred to as the high-side switch, and an n-type field effect transistor (NFET) 204, also referred to as the low-side switch, in a complementary structure. Both field effect transistors operate as a switch. When high-side switch 202 is in the ON state and NFET 204 is in the OFF state, the output voltage is pulled up to the $V_{DDH}$ level. When high-side switch 202 is in the OFF state and the NFET 204 is in the ON state, the output voltage is pulled down to the $V_{SSH}$ level. As is typical with PFET switches, the PFET is in the ON state when the gate voltage is at least one PFET threshold below its source and is OFF when the gate-to-source voltage is zero. Similarly, typically with NFET switches, the NFET is in the ON state when the gate voltage is at least one NFET threshold above its source and is OFF when the gate-to-source voltage is zero.

The difficulty arises when the output requirements call for a higher voltage than is typically tolerated by the technology. For example, speaker drivers in PC audio applications must produce an average power of 2.5W on a 4-Ω speaker; therefore a 5V power supply is needed. However, most advanced integration technologies use 0.35 μm or smaller geometries that only produce 3.3V tolerant FET devices. Because the source of high-side switch 202 is tied to the power rail $V_{DDH}$, the control signal supplied to the gate of high-side switch 202 can only be allowed to drop 3.3V below $V_{DDH}$; for the case where $V_{DDH}$ is set to 5V, the gate cannot go below 1.7V. Similarly, the control signal supplied to the gate of low-side switch 204 can only be allowed to go 3.3V above $V_{SSH}$; for the case where $V_{SSH}$ is set to ground (0V), the gate cannot go above 3.3V.

Therefore in order to operate this circuit in this type of environment, level shifter 206 is used to shift a modulated signal so that the swing between the power supply voltage $V_{DDH}$ and the gate of high-side switch 202 never exceeds 3.3V. Additionally, level shifter 206 can also be used to supply the gate voltage to low-side switch 204 such that the swing between the gate and power supply voltage $V_{SSH}$ never exceeds 3.3V.

The level-shift operation should be fast, in particular there should be no significant delays between the signals to high-side switch 202 and low-side switch 204. Any delays between the signals can reduce the performance of the circuit; in class-D amplifiers a delay between the two signals in the output stage causes longer transition periods between the OFF and ON states of the output which produces a degradation in total harmonic distortion (THD).

Also, it is desirable to control the voltage levels at the gates of both high-side switch 202 and low-side switch 204 accurately. Ideally the gate-to-source voltage ($V_{GS}$) for high-side switch 202 in the ON state should be −3.3V and $V_{GS}$ for low-side switch 204 in the ON state should be 3.3V under all process, voltage, and temperature (PVT) conditions. However, it should not exceed these limits. In particular, variations in supply voltages $V_{DDH}$ and $V_{SSH}$ can be induced by large amounts of current flowing from and into the load which can be problematic. In the case of a class-D amplifier the current can flow in either direction resulting in a significant increase or decrease of supply potentials. For example, if the $V_{SSH}$ potential increases while low-side switch 204 is driven to 3.3V, its effective $V_{GS}$ is reduced resulting in increased resistance in the ON state. The increased resistance can result in requiring a larger FET, an increase in power consumption, a decrease in performance or a combination of all three. If the $V_{SSH}$ potential decreases the low-side switch 204 switch $V_{GS}$ is increased and may exceed the technology limitations causing reliability issues. Similar considerations apply to high-side switch 202 and $V_{DDH}$ variations.

It is important that level shifter 206 be able to maintain a controlled and constant output swing independent of the voltage of the power rails. This is especially challenging in the case of battery-operated systems where the positive power rail voltage can vary substantially depending on battery conditions.

In paper M. Berkhout "An Integrated 200-W Class-D Audio Amplifier", IEEE JSSC, vol. 38, no. 7, July 2003, an external bootstrap capacitor and an externally-decoupled power rail are used to drive the two power FETS. The bootstrap capacitor must be large compared to the capacitive load given by the high-side FET device, therefore it cannot be integrated. This is undesirable because to include this solution as part of an integrated package, additional pins must be supplied in order to use an external capacitor.

FIG. 3 is a circuit diagram of a known level-shifter for driving the high-side switch. The level-shifter comprises PFET 302 and NFET 308 coupled by a cascode pair, PFET 304 and NFET 306. The cascode pair is coupled to an intermediate voltage $V_{INT}$, which is typically the average of supply voltages $V_{DDH}$ and $V_{SSH}$. The output of the level shifter swings between $V_{DDH}$ and $V_{INT}+V_{thp}$ where $V_{thp}$ is the threshold voltage for PFET 304. As an example, if $V_{DDH}$ is 5V, $V_{SSH}$ is 0V, and $V_{thp}$ is 0.8V, $V_{INT}$ is equal to 2.5V and the high-side swing is only 1.7V, which falls short of the desired 3.3V. The suboptimal voltage swing as mentioned above leads to higher power consumption and lower performance by the output stage or requires a larger high-side switch. Even if a typical $V_{INT}$ was chosen to bring the voltage swing closer to the net 3.3V desired, the falling edge of the control signal is slow because for the control signal to go from high to low requires current to flow through three series pull-down elements PFET 304, NFET 306 and NFET 308. Finally, the net voltage swing is highly dependent on the supply voltages. Accordingly, various needs exist in the industry to address the aforementioned deficiencies and inadequacies.

SUMMARY OF INVENTION

In today's environment class-D amplifiers are used to provide an integrated solution for applications such as powered audio devices due to their advantages in power consumption and size over more traditional analog amplifiers. Due to power output requirements, the output stages of power drivers such as class-D amplifiers require a supply voltage in excess of the technologically allowed voltage for the switches in the output stage. A level shifter is used to ensure voltages supplied to the output switches do not exceed the technological limits. An ideal level shifter should provide the optimal voltage swing to output switches under all process, supply voltage and temperature (PVT) variations. The ideal level shifter should also provide fast transitions when the control signal changes from high to low and low to high.

An exemplary level shifter can comprise a pull-up transistor such as a PFET, where an input signal can cause it to pull up a high-side output to the high supply rail, a pull-down transistor such as an NFET, where an input signal can cause it to pull down the low-side output to the low supply rail and a floating battery element which maintains the voltage between the high-side output and the low-side output in such a way the target swing voltage is maintained even with PVT variations. The floating battery element comprises a battery transistor, bias network, a high-side clamping transistor and a low-side clamping transistor. The battery transistor can be an NFET with a high aspect ratio relative to the pull-down NFET. The level shifter can be used inside the output stage of a class-D amplifier or power driver.

The level shifter can comprise a means for pulling up a high-side output to a high supply rail having a high supply voltage, a means for pulling down a low-side output to a low supply rail having a low supply voltage; and a means for maintaining a voltage between the high-side output and the low-side output to insure the target swing voltage is maintained even with PVT variations. The means for maintaining the voltage can comprise a battery transistor, a means for biasing the battery transistor, a means for clamping the high-side output to a high-side clamping voltage coupled to the battery transistor, and a means for clamping the low-side output to a low-side clamping voltage coupled to the battery transistor.

Finally, a level shifting method can comprise pulling up the high-side output to a high supply rail having a high supply voltage when the input is high, pulling down a low-side output to a low supply rail having a low supply voltage when the input is low, maintaining a voltage between the high-side output and the low-side output substantially equal to the high supply voltage minus the low supply voltage and a target swing voltage, with the voltage tracking changes in the high supply voltage and the low supply voltage. The method for maintaining a voltage comprises biasing a battery transistor, clamping the high-side output when the high-side output goes low, and clamping the low-side output when the low-side output goes high.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Figure 1:
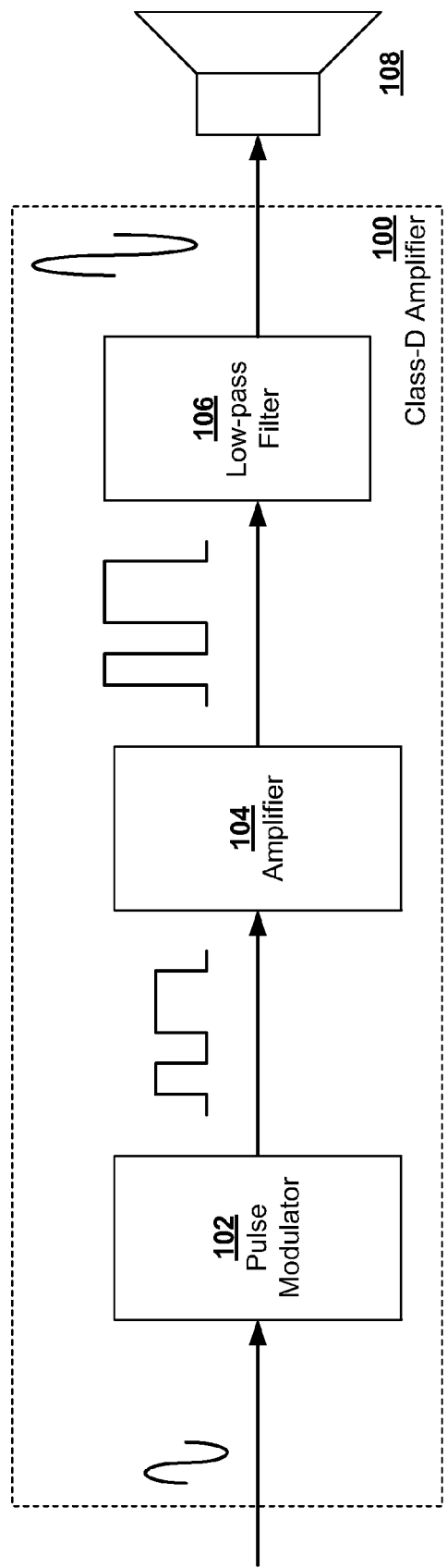
FIG. 1 is a block diagram illustrating the typical architecture of a class-D amplifier.
Figure 2:
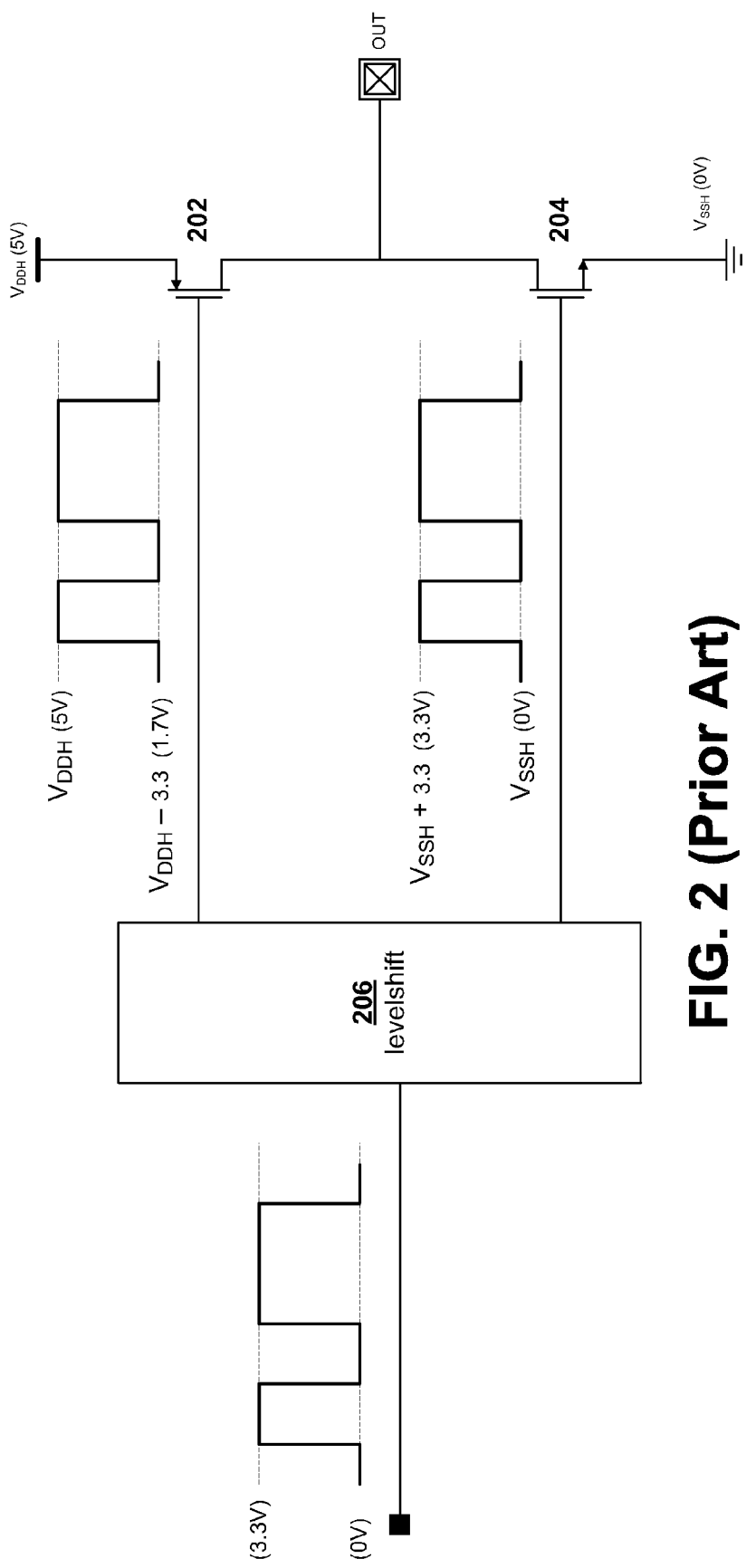
FIG. 2 is a circuit diagram the output stage of a power driver.
Figure 3:
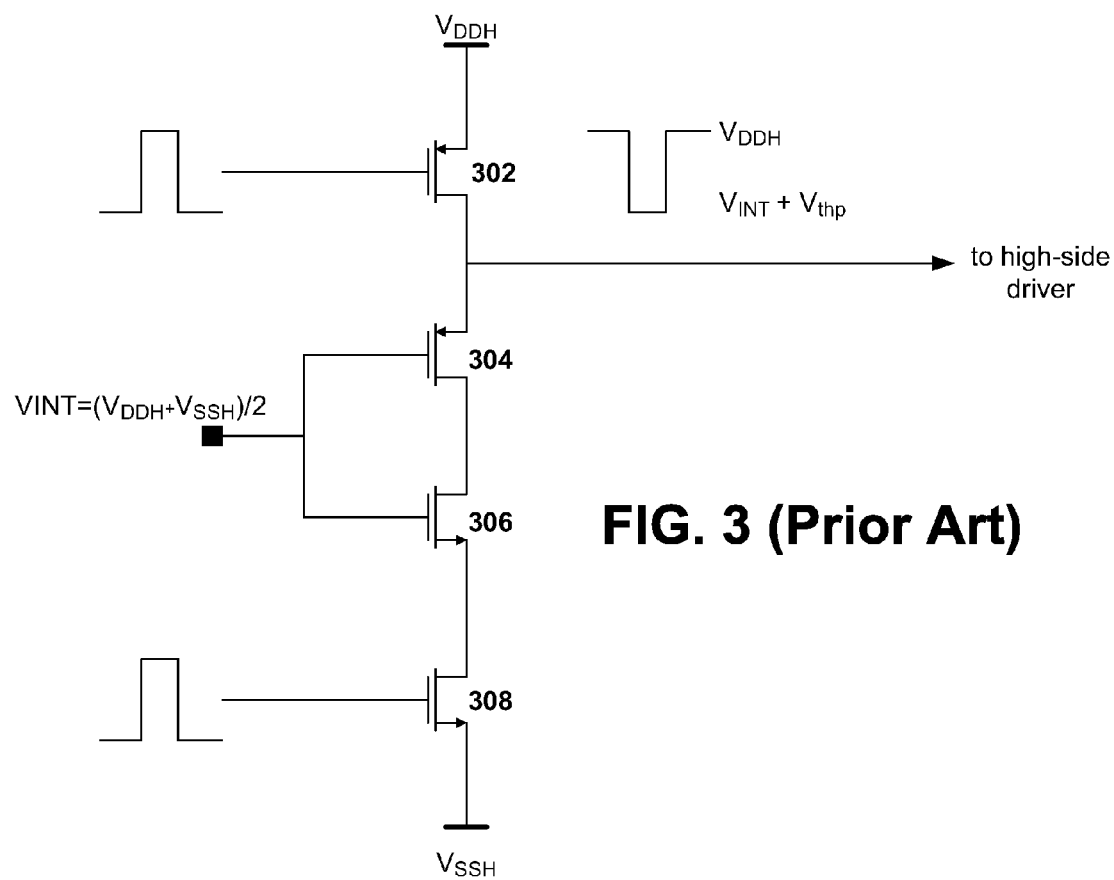
FIG. 3 is a circuit diagram of a known level-shifter for driving the high-side switch.
Figure 4:
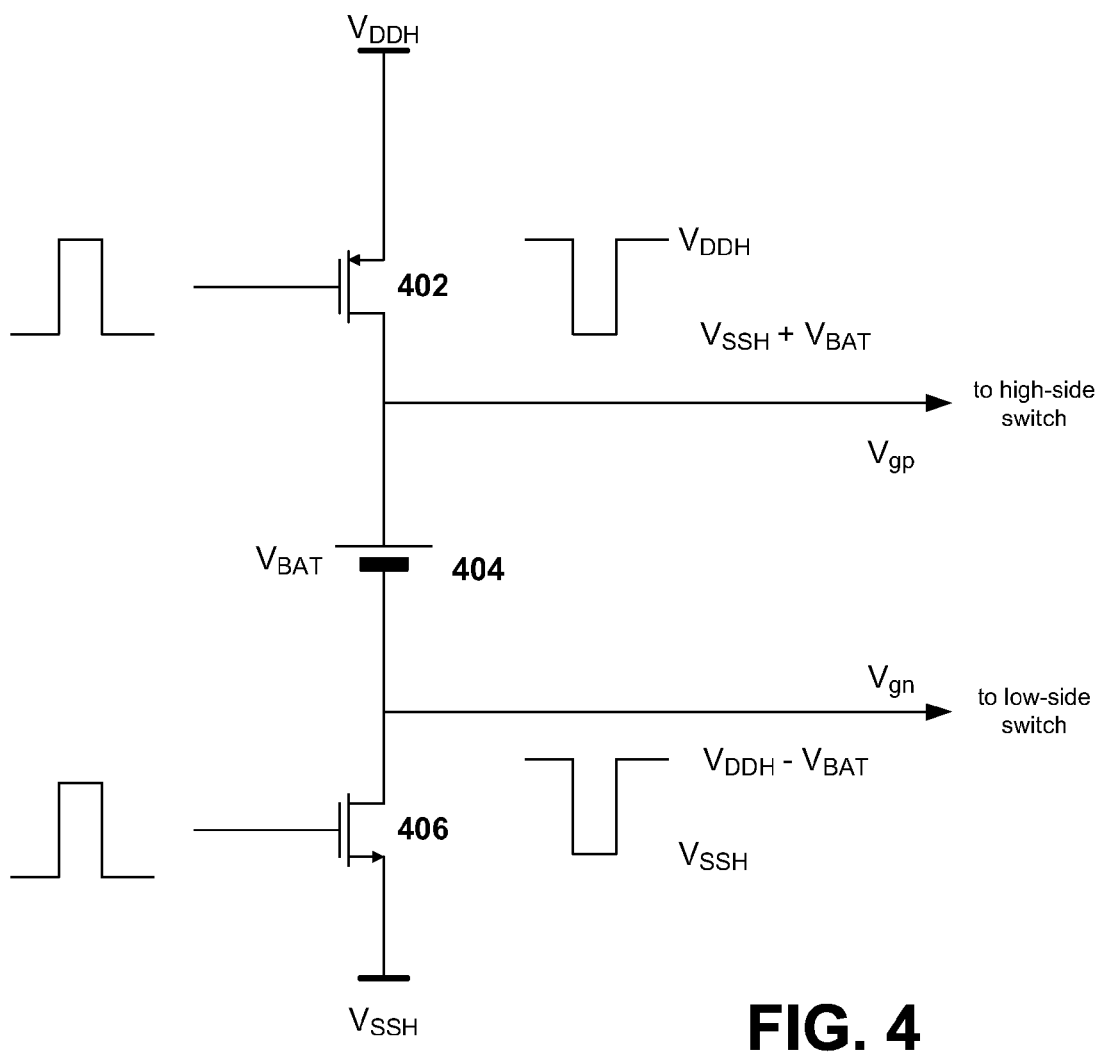
FIG. 4 is a circuit diagram of an embodiment of a level-shifter.

FIG. 4 is a circuit diagram of an embodiment of a level-shifter. The level shifter comprises pull-up PFET 402, pull-down NFET 406 and floating battery element 404. PFET 402 when switched ON pulls $V_{gp}$ up to the voltage supplied by the high supply rail which has a high supply voltage denoted by $V_{DDH}$. NFET 406 when switched ON pulls $V_{gn}$ down to the voltage supplied by the low supply rail which has a low supply voltage denoted by $V_{SSH}$ and is sometimes set to the ground potential. Floating battery element 404 maintains its voltage $V_{BAT}$ across its two terminals regardless of the current that is drawn through it. The advantage to this design is that the level-shifter is suitable to drive either high-side switch 202 or low-side switch 204 or both. Because there is only one pull-up transistor and one pull-down transistor, both transitions in the control signal, i.e., high-to-low and low-to-high are fast. The potential across floating battery element 404 can be chosen to maximize the swing across both high-side switch 202 and low-side switch 204. In particular, the voltage $V_{gp}$ supplied to high-side switch 202 swings between $V_{DDH}$ and $V_{SSH}+V_{BAT}$ and the voltage $V_{gn}$ supplied to low-side switch 204 swings between $V_{SSH}$ and $V_{DDH}-V_{BAT}$, so a nominal choice of 1.7V for $V_{BAT}$ optimizes the voltage swing across both switches to 3.3V for the case of $V_{DDH}$=5.0V and $V_{SSH}$=0.0V.

Referring still to FIG. 4, the level-shifter satisfies two of the objectives sought, that the net swing voltage be optimal and the transitions in the control signal be fast. The third objective, that the net swing voltages be optimal regardless of variations in the supply and ground voltages, can be met if $V_{BAT}$ is dynamically adjusted as a function of the supply voltages $V_{DDH}$ and $V_{SSH}$ such that the output swing becomes independent of them. An optimal swing voltage allows for optimal sizing of the output stage switches; that is if the swing can be maximized within technological limits, the switches in the output stages can be made smaller. If $V_{swing}$ is the optimal swing voltage, it is desirable to set $V_{BAT}$ equal to $V_{DDH}-V_{swing}-V_{SSH}$. With this setting for $V_{BAT}$, $V_{gp}$ swings between $V_{DDH}-V_{swing}$ and $V_{DDH}$, and $V_{gn}$ swings between $V_{SSH}$ and $V_{SSH}+V_{swing}$. Thus the voltage swing on both outputs $V_{gp}$ and $V_{gn}$ is equal to $V_{swing}$ independent of the potentials of $V_{DDH}$ and $V_{SSH}$. One of ordinary skill will recognize that though $V_{BAT}$ should be set equal to $V_{DDH}-V_{swing}-V_{SSH}$ some potential variation may exist so the $V_{BAT}$ is set to a voltage substantially equal to $V_{DDH}-V_{swing}-V_{SSH}$.

Figure 5:
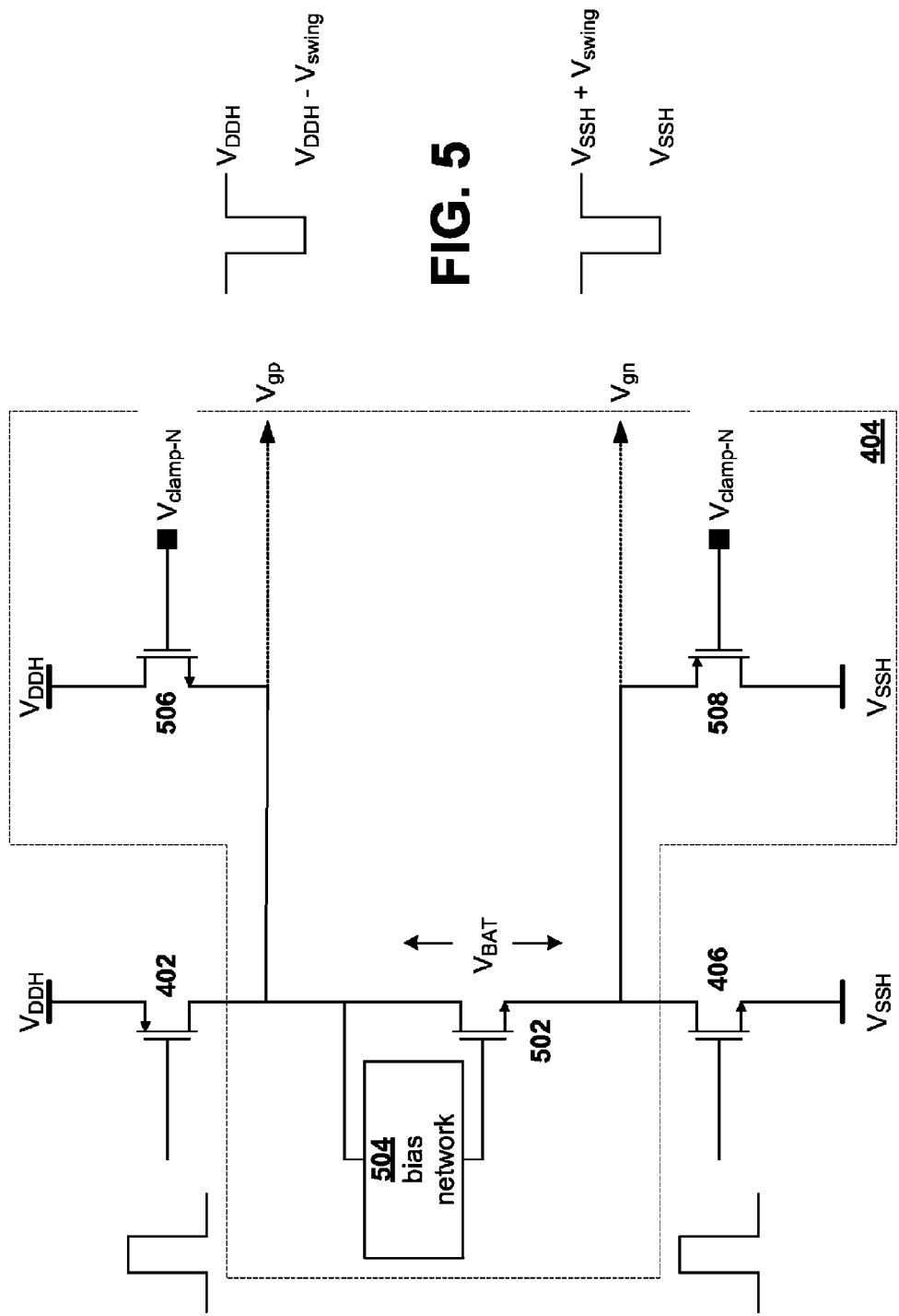
FIG. 5 is a circuit diagram of an embodiment of a floating battery element that can be used to dynamically adjust VBAT to match variations in the supply and ground voltages.

FIG. 5 is a circuit diagram of an embodiment of a floating battery element that can be used to dynamically adjust $V_{BAT}$ to match variations in the supply voltages. The floating battery element 404 comprises "battery" NFET 502, bias network 504, high-side clamping NFET 506, and low-side clamping PFET 508. Bias network 504 provides a voltage of $V_{BAT}-V_{thn}$ between the drain and gate of NFET 502, where $V_{thn}$ is the threshold of NFET 502. When NFET 502 has a drain-to-source voltage greater than $V_{BAT}$ NFET 502 turns ON. When NFET 502 has a drain-to-source voltage less than $V_{BAT}$ NFET 502 turns OFF.

High-side clamping NFET 506 is connected between $V_{DDH}$ and $V_{gp}$ and is designed to turn on when $V_{gp}$ drops below the target voltage $V_{DDH}-V_{swing}$ and thus prevents $V_{gp}$ from dropping further below the target voltage. This is achieved by setting $V_{clamp-N}=V_{DDH}-V_{swing}+V_{thn}$. Low-side clamping PFET 508 is connected between $V_{SSH}$ and $V_{gn}$, and is designed to turn on when $V_{gn}$ rises above its target voltage $V_{SSH}+V_{swing}$, in effect preventing $V_{gn}$ from further exceeding the target voltage. This is achieved by setting $V_{clamp-P}=V_{SSH}+V_{swing}-V_{thp}$. Again, in practicality the voltages described for $V_{clamp-N}$ and $V_{clamp-P}$ are set to voltages substantially equal to $V_{DDH}-V_{swing}+V_{thn}$ and $V_{SSH}+V_{swing}-V_{thp}$ respectively.

When the control signal received by NFET 406 and PFET 402 transitions from low to high, NFET 406 turns ON and at the same time PFET 402 turns OFF. NFET 406 pulls down the voltage $V_{gn}$ towards $V_{SSH}$. This causes the voltage across NFET 502 to exceed $V_{BAT}$ so NFET 502 turns ON and pulls down the voltage $V_{gp}$. If the size of NFET 502 is large relative to NFET 406 (referred to as the aspect ratio), the delay between the pull down of $V_{gn}$ and $V_{gp}$ is negligible. $V_{gn}$ is pulled all the way down to $V_{SSH}$ and $V_{gp}$ keeps dropping until NFET 502 turns OFF, which occurs when $V_{gp}=V_{SSH}+V_{BAT}=V_{DDH}-V_{swing}$. When NFET 502 is OFF, high-side clamping NFET 506 prevents $V_{gp}$ from falling further.

Similarly, when the control signal received by NFET 406 and PFET 402 transitions from high to low, NFET 406 turns OFF and at the same time PFET 402 turns ON. PFET 402 pulls up the voltage $V_{gp}$ towards $V_{DDH}$. This causes the voltage across NFET 502 to exceed $V_{BAT}$ so NFET 502 turns ON and pulls up the voltage $V_{gn}$. If the aspect ratio of NFET 502 is large relative to PFET 402, the delay between the pull up of $V_{gp}$ and $V_{gn}$ is negligible. $V_{gp}$ is pulled all the way up to $V_{DDH}$ and $V_{gn}$ keeps rising until the NFET 502 turns OFF, which occurs when $V_{gn}=V_{DDH}-V_{BAT}=V_{SSH}+V_{swing}$. When NFET 502 is OFF, low-side clamping PFET 508 prevents $V_{gn}$ from rising further. Therefore if bias network 504 can maintain a $V_{BAT}$ that adjusts with variations in supply or ground voltages, the level shifter can maintain an optimal swing voltage to high-side switch 202 and low-side switch 204.

Figure 6:
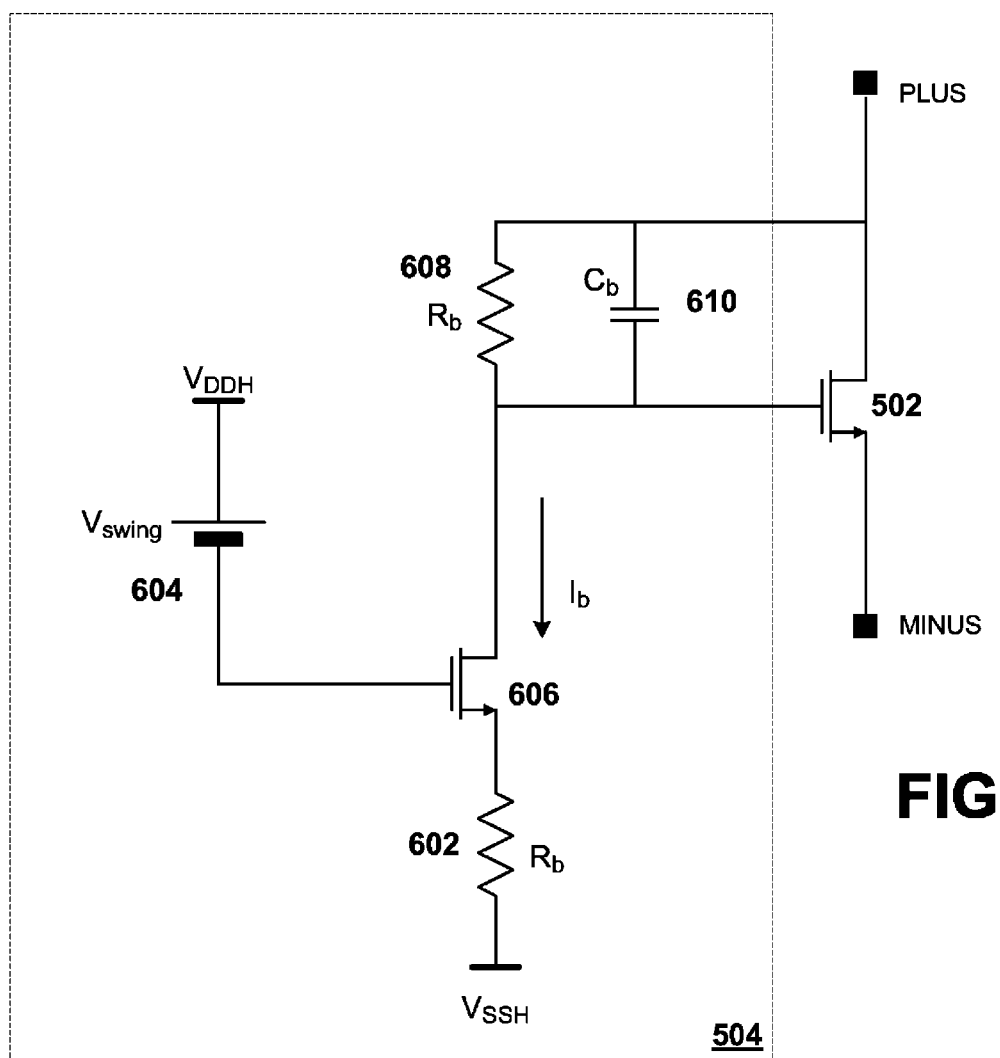
FIG. 6 is a circuit diagram of an exemplary embodiment of a bias network.

FIG. 6 is a circuit diagram of an exemplary embodiment of a bias network. The bias network comprises bias resistor 602, NFET 606, voltage source 604, resistor 608 and capacitor 610. The gate voltage for NFET 606 is $V_{DDH}-V_{swing}$, so the source voltage of NFET 606 is $V_{DDH}-V_{swing}-V_{thn}$, leaving a net voltage across resistor 602 of $V_{DDH}-V_{swing}-V_{thn}-V_{SSH}$. Bias resistor 602 and resistor 608 have the same resistance $R_b$ and since the same current $I_b$ is drawn through both resistors, resistor 608 also has a net voltage of $V_{DDH}-V_{swing}-V_{thn}-V_{SSH}$ across it. This insures that NFET 502 only switches ON when the drain to source voltage exceeds $V_{DDH}-V_{swing}-V_{SSH}$, the desired $V_{BAT}$ voltage. Capacitor 610 is added to maintain a constant voltage on resistor 608 during signal transitions.

The level shifter described above provides optimal swing voltages for $V_{gp}$ and $V_{gn}$ under all PVT conditions as proven by circuit simulations. Empirical results illustrating the performance of this level shifter circuit were obtained using transistor level simulations with Spectre tools by Cadence. Variations in process, voltage and temperature were part of this simulation.

The level shifter is capable of tracking large variations on the $V_{DDH}$ and the $V_{SSH}$ supply voltages which makes it suitable for battery operated power amplifiers. Compared to previous systems, the increase in voltage swing allows a reduction in size of the power switches without affecting their on-state resistance. In addition, voltage supply 404 does not cause a significant increase in the rise and fall time of signals $V_{gp}$ and $V_{gn}$, making this level shifter ideal for use in high-performance class-D amplifiers. Furthermore, this level shifter does not require any external components, hence does not add to the system cost or pin count.

It should be emphasized that the above-described embodiments are merely examples of possible implementations. Many variations and modifications may be made to the above-described embodiments without departing from the principles of the present disclosure. For example, the bias network could be based on switched-capacitor techniques. Also, it should be noted that the output voltage of 5V and the CMOS technology voltage limit of 3.3V serves as an example and this level shifter is applicable to other voltages such as the 2.5V or 1.8V CMOS technologies. All such modifications and variations are intended to be included herein within the scope of this disclosure and protected by the following claims.

What is claimed:

1. A level shifter circuit comprising:
   a pull-up transistor coupled to a first input, a variable high supply rail having a nominal high supply voltage, and a high-side output;
   a pull-down transistor coupled to a second input, a variable low supply rail having a nominal low supply voltage;
   a floating battery element coupled to the pull-down transistor and the pull-up transistor, wherein the floating battery element maintains a voltage substantially equal to the nominal high supply voltage minus 1) the nominal low supply voltage and 2) a target swing voltage, wherein the floating battery element comprises:
   a battery transistor having an input and terminals, said terminals coupled to the pull down transistor and the pull up transistor,
   a bias network coupled to the input of the battery transistor,
   a high-side clamping transistor coupled to the high supply rail, the high-side output, and a high-side clamping voltage; and
   a low-side clamping transistor coupled to the low supply rail, the pull down transistor, and a low-side clamping voltage.

2. The level shifter circuit of claim 1, wherein the first input and the second input receive a control signal.

3. The level shifter circuit of claim 1, wherein the nominal low supply voltage is a ground potential.

4. The level shifter circuit of claim 1 wherein the pull-down transistor is coupled to a low-side output.

5. The level shifter circuit of claim 1, wherein the pull-up transistor is a p-type field effect transistor (PFET).

6. The level shifter circuit of claim 1, wherein the pull-down transistor is an n-type field effect transistor (NFET).

7. The level shifter circuit of claim 1 wherein the battery transistor is an NFET which is larger than the pull-down transistor.

8. The level shifter circuit of claim 1 wherein the high-side clamping transistor is an NFET.

9. The level shifter circuit of claim 8 wherein the high-side clamping transistor has a threshold voltage and the high-side clamping voltage is substantially equal to the nominal high supply voltage 1) minus the target swing voltage 2) plus the threshold voltage.

10. The level shifter circuit of claim 1 wherein the low-side clamping transistor is a PFET.

11. The level shifter circuit of claim 10 wherein the low-side clamping transistor has a threshold voltage and the low-side clamping voltage is substantially equal to the nominal low supply voltage 1) plus the target swing voltage 2) minus the threshold voltage.

12. The level shifter circuit of claim 1 wherein the bias network comprises:
    an RC circuit;
    a current source transistor coupled to the RC circuit;
    a bias resistor coupled to the current source transistor and the low supply rail
    a voltage supply coupled to the high supply rail that maintains the swing voltage and coupled to the current source transistor.

13. The level shifter circuit of claim 12 wherein the current source transistor is an NFET.

14. A class D amplifier having an output stage wherein the output stage comprises:
    the level shifter of claim 1, wherein the pull-up transistor is coupled to a low-side output;
    a high-side switch coupled to the high-side output; and
    a low-side switch coupled to the low-side output.

15. A level shifter circuit comprising:
    means for pulling up a high-side output to a variable high supply rail having a nominal high supply voltage;
    means for pulling down a low-side output to a variable low supply rail having a nominal low supply voltage;
    means for maintaining a voltage between the high-side output and the low-side output substantially equal to the nominal high supply voltage minus 1) the nominal low supply voltage and 2) a target swing voltage, said means for maintaining a voltage is coupled to the means for pulling up and the means for pulling down, wherein the means for maintaining a voltage comprises:
    a battery transistor coupled to the means for pulling up and a means for pulling down;
    a means for biasing the battery transistor;
    a means for clamping the high-side output to a high-side clamping voltage coupled to the battery transistor; and
    a means for clamping the low-side output to a low-side clamping voltage coupled to the battery transistor.

16. The level shifter circuit of claim 15, wherein the low supply voltage is a ground potential.

17. A class D amplifier having an output stage wherein the output stage comprises:
    the level shifter of claim 15;
    a first means for switching coupled to the high-side output; and
    a second means for switching coupled to the low-side output.

18. A method for driving a high-side output and a low-side output based on an input comprising:
    pulling up the high-side output to a variable high supply rail having a nominal high supply voltage when the input is high using a pull-up transistor;
    pulling down a low-side output to a variable low supply rail having a nominal low supply voltage when the input is low using a pull-up transistor;
    biasing a battery transistor coupled between the pull-up transistor and the pull-down transistor,
    clamping the high-side output to the nominal high supply voltage minus a swing voltage when the high-side output goes low using a high-side clamping transistor coupled to the high supply rail, the high-side output and a high-side clamping voltage; and
    clamping the low-side output to the nominal low supply voltage plus a swing voltage when the low-side output goes high using a low-side clamping transistor coupled to the low supply rail, the low-side output and a low-side clamping voltage.

* * * * *

UNITED STATES PATENT AND TRADEMARK OFFICE
CERTIFICATE OF CORRECTION

| | | |
|---|---|---|
| PATENT NO. | : 7,982,525 B2 | Page 1 of 1 |
| APPLICATION NO. | : 12/390333 | |
| DATED | : July 19, 2011 | |
| INVENTOR(S) | : Lorenzo Crespi et al. | |

It is certified that error appears in the above-identified patent and that said Letters Patent is hereby corrected as shown below:

Column 8, line 31, replace "pull-up" with "pull-down"

Signed and Sealed this
Twentieth Day of September, 2011

David J. Kappos
*Director of the United States Patent and Trademark Office*